United States Patent
Wu

(10) Patent No.: US 6,239,007 B1
(45) Date of Patent: May 29, 2001

(54) METHOD OF FORMING T-SHAPED GATE

(75) Inventor: Chi-Hsi Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/513,268

(22) Filed: Feb. 24, 2000

(30) Foreign Application Priority Data

Dec. 10, 1999 (TW) .............................................. 088121711

(51) Int. Cl.⁷ .............................................. H01L 21/3205
(52) U.S. Cl. .............................................. 438/585; 438/182
(58) Field of Search .................................... 438/585, 182, 438/197, 592; 257/249, 413

(56) References Cited

U.S. PATENT DOCUMENTS

| | | | |
|---|---|---|---|
| 4,839,304 | * | 6/1989 | Morikawa ............................. 437/39 |
| 4,849,376 | * | 7/1989 | Balzan et al. ......................... 437/228 |
| 6,159,781 | * | 12/2000 | Pan et al. ............................. 438/167 |

* cited by examiner

*Primary Examiner*—David Nelms
*Assistant Examiner*—Quoc Hoang
(74) *Attorney, Agent, or Firm*—Jiawei Huang; J.C. Patents

(57) ABSTRACT

A method of forming a T-shaped gate. Two insulation layers, each having a different etching rate, are sequentially formed over a conventional gate structure. A planarization of the insulation layer is next carried out. Utilizing the difference in etching rate between the two insulation layers, the insulation layer above the gate structure is removed to expose the gate structure. A conductive layer is then formed over the exposed gate structure. Another planarization is carried out so that only the portion of conductive layer above the gate structure is retained. While using the conductive layer above the gate structure as an etching mask, the two insulation layers are removed. A silicide process is carried out to form a silicide layer over the conductive layer.

20 Claims, 2 Drawing Sheets

METHOD OF FORMING T-SHAPED GATE

CROSS-REFERENCE TO RELATED APPLICATION

This application claims the priority benefit of Taiwan application Ser. No. 088121711, filed Dec. 10, 1999.

BACKGROUND OF THE INVENTION

1. Field of the Invention

The present invention relates to a method of forming the gate of an integrated circuit device. More particularly, the present invention relates to a method of forming a T-shaped gate.

2. Description of the Related Art

As the level of integration of integrated circuit rises, dimensions of each semiconductor device are reduced and the adverse effects of having a narrow line width are more prominent.

To counteract the rapid increase in sheet resistance due to a narrow line width, a metal silicide layer is formed over the source, drain and gate terminals of a transistor. Hence, electrical conductivity between a transistor terminal and a conductive line is increased.

Conventionally, the metal silicide layer over transistor terminals is formed by a self-aligned silicide (Salicide) process. After a transistor consisting of a polysilicon gate, a gate oxide layer, a source terminal, a drain terminal and spacers is formed, a metallic layer is formed over the transistor. A thermal operation is conducted so that metallic atoms in the metallic layer can react with silicon atoms on the surface of the polysilicon gate, the source terminal and the drain terminal to form a metal silicide layer. finally, the unreacted metal is removed.

Another method of lowering sheet resistance at the gate besides forming a silicide layer over the gate is to form a T-shaped gate terminal. However, a selective silicon growth process is the conventional method of forming a T-shaped gate terminal. Selective silicon growth is an expensive process and has a small processing window. Therefore, cost of production is high and throughput is low, which means it is not suitable for volume production in a manufacturing facility.

SUMMARY OF THE INVENTION

The invention provides a method of forming a T-shaped gate. A semiconductor substrate is provided. A gate structure is formed over the semiconductor substrate. A first insulation layer is formed over the gate structure and the semiconductor substrate, and then a second insulation layer is formed over the first insulation layer. The second insulation layer is planarized so that a portion of the first insulation layer above the gate structure is exposed. The first insulation layer above the gate structure is removed to expose the top surface of the gate structure. A conductive layer is next formed over the gate structure and the second insulation layer. The conductive layer above the second insulation layer is removed retaining the conductive layer above the gate structure. Finally, the first insulation layer and the second insulation layer are removed while using the conductive layer above the gate structure as an etching mask.

In the present invention, two insulation layers, each having a different etching rate, are sequentially formed over a conventional gate structure. A planarization of one of the insulation layers is next carried out. Utilizing the difference in etching rate between the two insulation layers, the insulation layer above the gate structure is removed to expose the gate structure. A conductive layer is then formed over the exposed gate structure. Another planarization is carried out so that only the portion of conductive layer above the gate structure is retained. While using the conductive layer above the gate structure as an etching mask, the two insulation layers are removed. Finally, a silicide process is carried out to form a silicide layer over the conductive layer.

Sheet resistance of the T-shaped gate terminal is lowered in the invention without a corresponding increase in gate dimensions. Hence, the narrow line effect due to dimensional reduction is improved.

In the process of forming the T-shaped gate terminal, processes having a larger processing window and less expensive operating cost than conventional selective silicon growth process are used. Hence, productive cost is reduced and throughput is increased, which means the process of the invention is more suitable for large-scale production.

Accordingly, the present invention provides a method of forming a T-shaped gate having a higher processing window and a lower cost of production than the conventional selective silicon growth process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
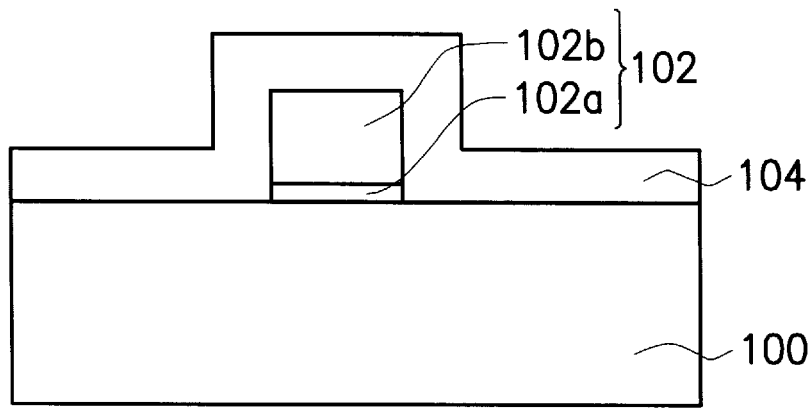
FIGS. 1A through 1F are schematic cross-sectional views showing the progression of steps for producing a T-shaped gate according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the progression of steps for producing a T-shaped gate according to one preferred embodiment of the invention.

As shown in FIG. 1A, a semiconductor substrate 100 having a gate structure 102 thereon is provided. The gate structure 102, including a stack containing a conductive layer 102b over a gate dielectric layer 102a, is formed by conventional processes. The gate dielectric layer 102a can be a silicon oxide layer formed, for example, by thermal oxidation. The conductive layer 102b can be a polysilicon layer formed, for example, by chemical vapor deposition. In addition, lightly doped drain (LDD) structures (not shown) can also be formed in the semiconductor substrate 100 by using the gate structure 102 as an ion mask to reduce a hot electron effect due to a short-channel in a MOS transistor. An insulation layer 104 is formed over the gate structure 102 and the semiconductor substrate 100. The insulation layer 104 can be a silicon oxide layer formed, for example, by chemical vapor deposition.

Figure 1B:
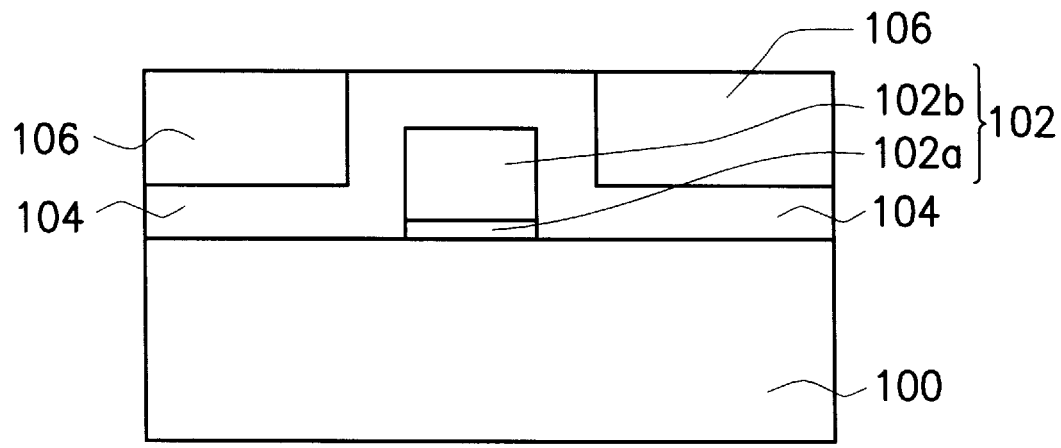

As shown in FIG. 1B, a second insulation layer 106 is formed over the first insulation layer 104. A planarization of the insulation layer 106 is carried out next so that a portion of the insulation layer 104 is exposed. The first insulation layer 104 and the second insulation layer 106 must have different etching rates for the same etchant. Hence, if the insulation layer 104 is a silicon oxide layer, the insulation layer 106 can be a silicon nitride layer formed, for example, by chemical vapor deposition. The planarization of the insulation layer 106 can be carried out, for example, by chemical-mechanical polishing (CMP).

Figure 1C:
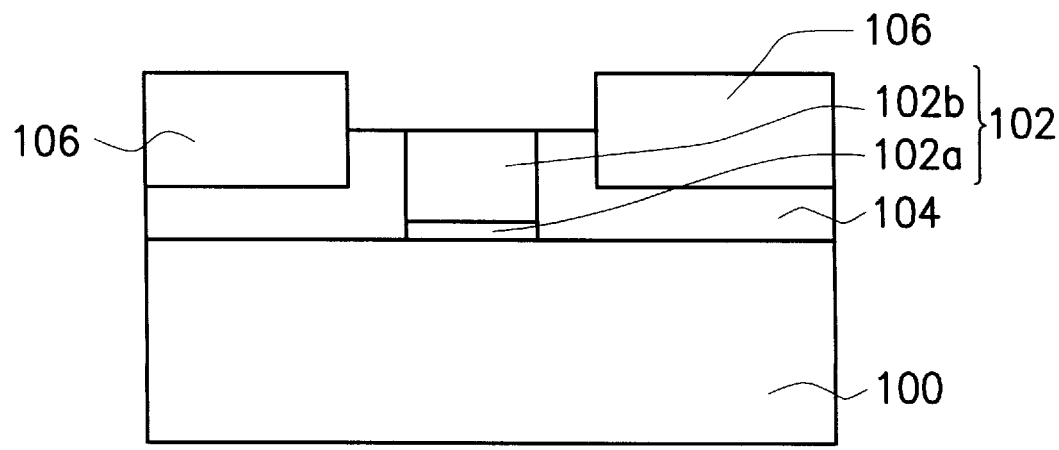

As shown in FIG. 1C, the insulation layer 104 above the gate structure 102 is removed so that a top surface of the gate structure 102 is exposed. The insulation layer 104 above the gate structure 102 can be removed, for example, by dry etching. The insulation layer 106 is used as an etching mask and the conductive layer 102b of the gate structure 102 is used as an etching stop layer in the dry etching step.

Figure 1D:
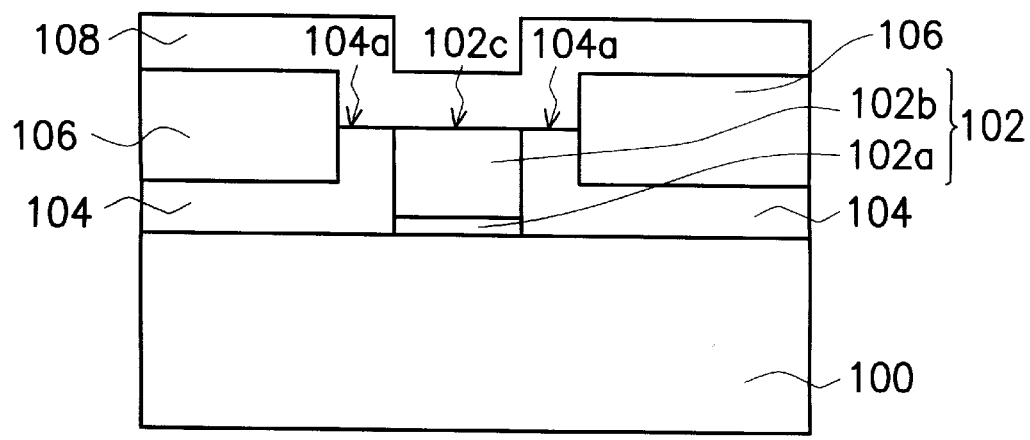

As shown in FIG. 1D, a conductive layer 108 is formed over the insulation layer 106, surface 102c of the exposed gate structure 102 and surface 104a of the insulation layer 104. The conductive layer 108 can be a polysilicon layer formed, for example, by chemical vapor deposition.

Figure 1E:
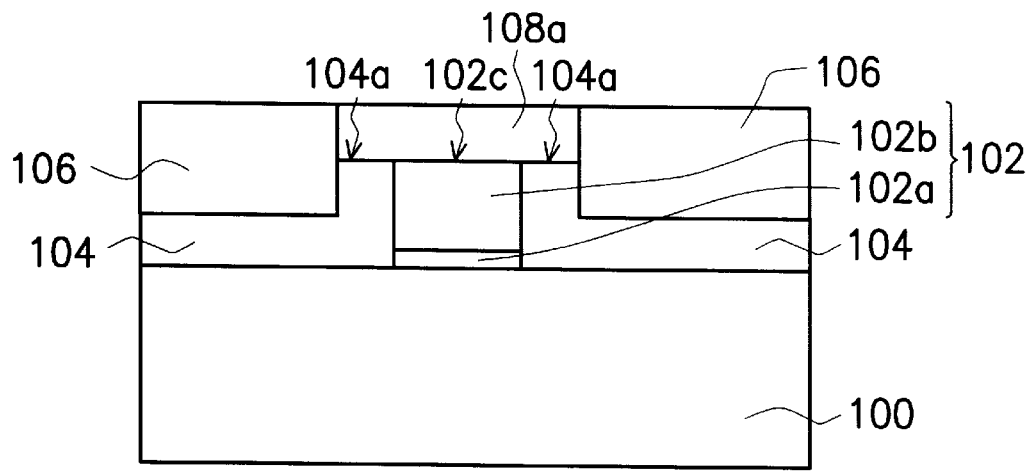

As shown in FIG. 1E, the conductive layer 108 above the insulation layer 106 is removed. Hence, only a portion of the conductive layer 108a remains above the surface 102c of the gate structure 102 and the surface 104a of the insulation layer 104. The conductive layer 108a and the conductive layer 102b of the gate structure 102 together constitute the T-shaped gate terminal of the invention. The conductive layer 108 above the insulation layer 106 can be removed, for example, by chemical-mechanical polishing while using the insulation layer 106 as a polishing stop layer.

Figure 1F:
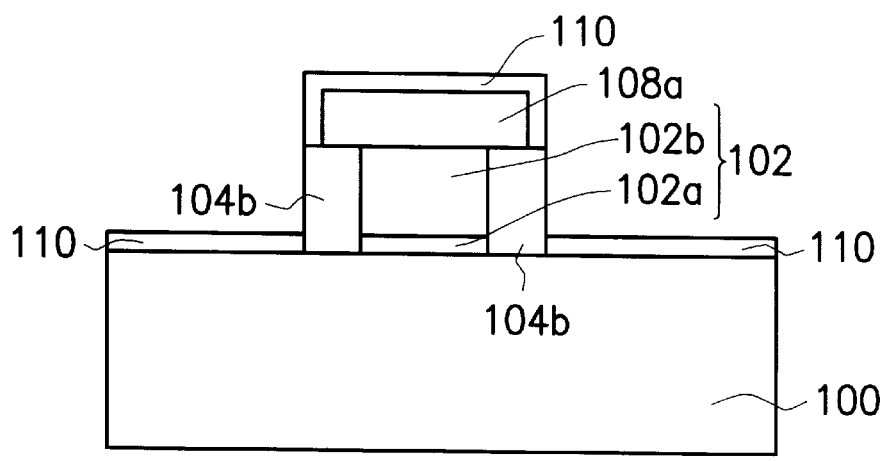

As shown in FIG. 1F, the insulation layer 106 and a portion of the insulation layer 104 is removed while using the conductive layer 108a as an etching mask. Ultimately, only an insulation layer 104b on each side of the gate structure 102 under the conductive layer 108a remains. An ion implantation is carried out to form a source terminal and a drain terminal (not shown) in the semiconductor substrate 100. A metal silicide process is then conducted to form a metal silicide layer 110 over the conductive layer 108a and the substrate 100. The metal silicide layer 110 can be a titanium silicide layer formed, for example, by depositing titanium over the conductive layer 108a and the semiconductor substrate 100 and then performing two thermal treatments. Since conventional processes are used to fabricate the remaining portion of the integrated circuit, detailed description is omitted here.

In summary, the T-shaped gate is formed by sequentially depositing two insulation layers, each having a different etching rate, over a conventional gate structure. A planarization of the insulation layer is next carried out. Utilizing the difference in etching rate between the two insulation layers, the insulation layer above the gate structure is removed to expose the gate structure. A conductive layer is then formed over the exposed gate structure. Another planarization is carried out so that only the portion of conductive layer above the gate structure is retained. While using the conductive layer above the gate structure as an etching mask, the two insulation layers are removed. A silicide process is carried out to form a silicide layer over the conductive layer.

Sheet resistance of the T-shaped gate terminal is lowered in the invention without a corresponding increase in gate dimensions. Hence, the narrow line effect due to dimensional reduction is improved.

In the process of forming the T-shaped gate terminal, processes having a larger processing window and less expensive operating cost than conventional selective silicon growth process are used. Hence, productive cost is reduced and throughput is increased, which means the process of the invention is more suitable for large-scale production.

It will be apparent to those skilled in the art that various modifications and variations can be made to the structure of the present invention without departing from the scope or spirit of the invention. In view of the foregoing, it is intended that the present invention cover modifications and variations of the invention provided they fall within the scope of the following claims and their equivalents.

What is claimed is:

1. A method of forming a T-shaped gate, comprising the steps of:

providing a semiconductor substrate;

forming a gate structure over the semiconductor substrate;

forming a first insulation layer over the gate structure and the semiconductor substrate;

forming a second insulation layer over the first insulation layer;

planarizing the second insulation layer so that the first insulation layer above the gate structure is exposed;

removing the first insulation layer above the gate structure so that the gate structure is exposed;

forming a conductive layer over the gate structure and the second insulation layer;

removing the conductive layer above the second insulation layer while retaining the conductive layer above the gate structure; and removing the first insulation layer and the second insulation layer while using the conductive layer above the gate structure as an etching mask.

2. The method of claim 1, wherein the gate structure includes a stack containing a polysilicon layer over a gate oxide layer.

3. The method of claim 1, wherein the step of forming the first insulation layer includes depositing silicon oxide.

4. The method of claim 1, wherein the second insulation layer and the first insulation layer have a fixed etching selectivity ratio.

5. The method of claim 1, wherein step of forming the second insulation layer includes depositing silicon nitride.

6. The method of claim 1, wherein the step of planarizing the second insulation layer includes chemical-mechanical polishing.

7. The method of claim 1, wherein the step of forming the conductive layer includes depositing polysilicon.

8. The method of claim 7, wherein after the step of removing the first and the second insulation layer, further includes carrying out a metal silicide process so that a metal silicide layer is formed over the conductive layer and the semiconductor substrate.

9. A method of forming a T-shaped gate, comprising the steps of:

providing a semiconductor substrate;

forming a gate structure over the semiconductor substrate, wherein the gate structure is a stack that includes a polysilicon layer over a gate oxide layer;

forming a first insulation layer over the gate structure and the semiconductor substrate;

forming a second insulation layer over the first insulation layer;

planarizing the second insulation layer so that the first insulation layer above the gate structure is exposed;

removing the first insulation layer above the gate structure so that the gate structure is exposed;

forming a polysilicon layer over the gate structure and the second insulation layer;

removing the polysilicon layer above the second insulation layer while retaining the polysilicon layer above the gate structure;

removing the first insulation layer and the second insulation layer while using the polysilicon layer above the gate structure as an etching mask;

performing an ion implantation to form a source terminal and a drain terminal in the semiconductor substrate; and conducting a metal silicide process to form a metal silicide layer over the exposed polysilicon layer and semiconductor substrate.

10. The method of claim 9, wherein the step of forming the first insulation layer includes depositing silicon oxide.

11. The method of claim 9, wherein the second insulation layer and the first insulation layer has a fixed etching selectivity ratio.

12. The method of claim 9, wherein step of forming the second insulation layer includes depositing silicon nitride.

13. The method of claim 9, wherein the step of planarizing the second insulation layer includes chemical-mechanical polishing.

14. A method of forming a T-shaped gate, the method comprising the steps of:

providing a semiconductor substrate;

forming a gate structure over the semiconductor substrate;

forming a first insulation layer on the gate structure and the semiconductor substrate;

forming a second insulation layer on the first insulation layer;

planarizing the second insulation layer so that the first insulation layer above the gate structure is exposed;

removing a portion of the first insulation layer above the gate structure until a top surface of the gate structure is exposed;

forming a conductive layer on the gate structure, the first insulation layer and the second insulation layer;

planarizing the conductive layer using the second insulation layer as a stop layer, so that a portion of the conductive layer is retained above the gate structure;

removing the first insulation layer and the second insulation layer while using the conductive layer above the gate structure as an etching mask; and conducting a metal silicide process so that a metal silicide layer is formed on the conductive layer and the semiconductor substrate.

15. The method of claim 14, wherein the gate structure includes a stack containing a polysilicon layer over a gate oxide layer.

16. The method of claim 14, wherein the step of forming the first insulation layer includes depositing silicon oxide.

17. The method of claim 14, wherein the second insulation layer and the first insulation layer have a fixed etching selectivity ratio.

18. The method of claim 14, wherein step of forming the second insulation layer includes depositing silicon nitride.

19. The method of claim 14, wherein the step of planarizing the second insulation layer includes chemical-mechanical polishing.

20. The method of claim 14, wherein the step of forming the conductive layer includes depositing polysilicon.

* * * * *